(12) United States Patent
Pramono

(10) Patent No.: US 7,024,644 B2
(45) Date of Patent: Apr. 4, 2006

(54) IC SIGNAL PATH RESISTANCE ESTIMATION METHOD

(75) Inventor: Eddy Pramono, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 105 days.

(21) Appl. No.: 10/435,346

(22) Filed: May 8, 2003

(65) Prior Publication Data

US 2004/0225975 A1    Nov. 11, 2004

(51) Int. Cl.
    *G06F 17/50* (2006.01)
(52) U.S. Cl. .................. 716/5; 716/8; 707/7; 707/102
(58) Field of Classification Search ............ 716/5–6, 716/8–14; 707/7, 102
    See application file for complete search history.

(56) References Cited

U.S. PATENT DOCUMENTS 5,552,718 A * 9/1996 Bruce et al. ............... 324/765
6,360,350 B1 * 3/2002 Gabele et al. .............. 716/1

2003/0237063 A1 * 12/2003 Kauth et al. ............... 716/5

* cited by examiner

*Primary Examiner*—Vuthe Siek
(74) *Attorney, Agent, or Firm*—Daniel J. Bedell; Smith-Hill and Bedell

(57) ABSTRACT

Diffusion effects during an IC fabrication process cause actual dimensions of adjacent conductors in an IC to vary from nominal dimensions specified by data defining the IC layout. A computer-aided design tool processes the layout data to generate a separate database for each layer of the IC, including a separate table corresponding to each grid line of that layer. Each table includes a separate table entry corresponding to each conductor to reside along the table's corresponding grid line, each table entry indicating nominal dimensions and position of its corresponding conductor. The tool sorts grid line tables within each layer's database in an order in which their corresponding grid lines are arranged on that layer, and sorts entries in each table in an order in which their corresponding conductors are to appear along the table's corresponding grid line. The tool then reads each entry in each table of each database only once, in the orders in which the entries and tables are sorted, to obtain information it needs to estimate actual dimensions of each conductor, and estimates the resistance of each conductor as a function of its estimated actual dimensions.

13 Claims, 5 Drawing Sheets

IC SIGNAL PATH RESISTANCE ESTIMATION METHOD

BACKGROUND OF THE INVENTION

1. Field of the Invention

The present invention relates in general to computer-aided design (CAD) tools for generating and analyzing integrated circuit (IC) layouts, and in particular to a method employed by a resistance/capacitance (RC) extraction tool for estimating resistance of signal paths described by an IC layout.

2. Description of Related Art

A typical IC die includes a semiconductor substrate containing transistors and other objects and conductors formed on layers of insulating material above the substrate for routing signals between the transistors and other objects in the substrate. Designers often want to know the path delays through signal paths formed by these conductors, and since the path delay through a conductor is largely a function of its shunt capacitance and series resistance, designers employ RC extraction tools to determine the resistances and capacitances of the conductors forming those signal paths. The resistance of any conductor is a function of its length and cross-sectional area and of the resistivity of the material forming it. An RC extraction tool processes layout data describing the IC layout to determine the dimensions of each conductor on each layer so that it can calculate its resistance.

The conductor and other IC component dimensions indicated by the layout data control the dimensions and positions of apertures in a set of photo-lithographic masks employed during IC fabrication, and these apertures and the spacing between them in turn control the actual dimensions of and spacing between the conductors and other objects of the IC.

FIG. 1 is a sectional elevation view of an upper portion of an IC during the fabrication process including a metal layer 10 formed on an insulating layer 11. A layer 13 of photoresist material has been deposited on metal layer 10. Apertures 15 between areas 17 of a photo-lithographic mask 14 permit light 16 to strike photoresist layer 13 above areas of metal layer 10 that are to be removed. Light 16 sensitizes those areas of photoresist material 13 so that they, and the portions of metal layer 10 below them, can be etched away.

FIG. 2 illustrates a set of conductors 18A–18D formed from metal layer 10 after it has been etched and residual portions of photoresist material 13 have been removed. Note that conductors 18A–18D are slightly narrower than the portions 17 of mask 14 of FIG. 1 that defined them due to effects of light diffraction at the edges of apertures 15. An RC extraction tool processing the layout data defining mask 14 that assumes conductors 18A–18D will be of the same width and the dimensions of the areas 17 of mask 14 directly above them will underestimate the resistance of conductor's 18A–18D because it will overestimate their widths. However the percentage of resistance underestimation will be small when mask areas 17 and the apertures 15 between them are relatively wide because diffusion effects will narrow conductors 18A–18D only by a small percentage of their widths.

As transistors and other IC components have grown steadily smaller over the years, so too have conductor widths and the minimum spacing between adjacent conductors on the same layer. FIG. 3 is a sectional elevation view of an upper portion of an IC during the fabrication process including a metal layer 19 formed on an insulating layer 20. A layer 26 of photoresist material has been deposited on metal layer 19. Apertures 22 in a photo-lithographic mask 21 permit light 23 to strike photoresist layer 26 above areas of metal layer 19 that are to be removed while mask areas 24 block light from reaching areas of metal layer 19 that are to remain. FIG. 4 illustrates a resulting set of conductors 25A–25D formed from metal layer 10 after it has been etched and residual portions of photoresist material 13 have been removed.

In the example of FIGS. 3 and 4, the relatively narrow mask aperture 22 diffuse light farther beyond their edges than the relatively wide apertures of FIG. 1. Thus conductors 25A–25D of FIG. 4 are substantially narrower than conductors 18A–18D of FIG. 2 even though the mask areas 24 defining conductors 25A–25D and mask areas 17 defining conductors 18A–18D are of the same width. Note the lack of uniformity of width of conductors 25A–25D. Conductors 25B and 25C are substantially narrower than conductors 25A and 25D because apertures 22 produced substantial diffusion-related conductor narrowing on both sides of conductors 25B and 25C and on only one side of each of conductors 25A and 25D. Thus an RC extraction tool processing layout data defining mask 21 would overestimate the widths of conductors 25A and 25D by a substantial amount and would overestimate the widths of conductors 25B and 25C by an even greater amount. The overestimation of conductor width results in an underestimation of conductor resistance, and that can lead to substantial errors in estimation of path delays through the conductors.

FIG. 5 is a plan view of several conductors 30–37 formed on an IC layer along a set of evenly spaced grid lines G=1 through 6. The areas of the photo-lithographic mask used to define conductors 30–37 were of similar widths, but in this example grid lines 1–6 are sufficiently close together that diffusion effects substantially narrow adjacent conductors. Note for example, that conductor 32 is narrowed on its left side in areas proximate to conductors 30 and 31 and is narrowed on its right side in areas proximate to conductors 33 and 34.

An RC extraction tool estimating the actual dimensions of any of conductors 30–37 based on the information contained in IC layout data must therefore take into account not only the nominal dimensions that conductor would have in the absence of diffusion effects, but must also take into account the nominal dimensions and relative position of adjacent conductors so that it can adjust its estimates of conductor dimensions to account for diffusion effects.

Layout data typically indicates positions of endpoints of each conductor of each layer along the layer's grid lines. To determine the resistance of, for example, conductor 32 of FIG. 5 merely from positions of that conductor's endpoints along grid line 2 as indicated by the IC layout data, an RC extraction tool must also know not only the nominal width of the conductor, but also the positions and dimensions of endpoints of its neighboring conductors 30, 31, 33 and 34 so that it can take into account diffraction effect with ascertaining the actual shape of conductor 32. Thus after determining the position and nominal dimensions conductor 32 from the layout data, an RC extraction must search the layout data to determine whether any other conductors are sufficiently close to conductor 32 to cause diffraction-related effects on the shape of conductor 32. This need to search the layout data to find each conductor's neighbors can substantially increase the number of times an RC extraction tool must access the layout data for each conductor, thereby substantially increasing the amount of time it needs to estimate conductor resistance, particularly when the RC extraction tool does not have sufficient memory resources to hold all of the layout data in memory at the same time.

What is needed is a method for processing layout data to estimate conductor resistances that minimizes the number of times data describing the position and nominal dimensions of each conductor is accessed.

BRIEF SUMMARY OF THE INVENTION

Diffusion effects during an IC fabrication process cause actual dimensions of adjacent conductors residing along parallel grid lines on the various layers of an IC to vary in a predictable manner from nominal dimensions of the conductors as specified by layout data controlling IC fabrication. The invention relates to a method an RC extraction tool can use for processing the layout data to estimate actual dimensions of each conductor as functions of that conductor's nominal dimensions and of the dimensions and relative position of any adjacent conductors so as to take diffusion effects into account. The RC extraction tool can then accurately estimate the path resistance of each conductor as a function of its estimated actual dimensions.

In accordance with an embodiment of the invention, the RC extraction tool processes the layout data to generate a separate database for each layer of the IC, including a separate table corresponding to each grid line of that layer. The table for each grid line includes a separate table entry corresponding to each conductor that is to reside along the table's corresponding grid line, and each table entry indicates nominal dimensions and position of its corresponding conductor. The RC extraction tool sorts the grid line tables within each layer's database in an order in which their corresponding grid lines are arranged on that layer, and sorts the entries within each table in an order in which their corresponding conductors are to appear along the table's corresponding grid line.

After the generating the sorted databases, the RC extraction tool reads each entry in each table of each database into memory only once, in the order in which the tables and databases were sorted. The RC extraction tool then estimates the actual dimensions and resistance of each conductor whenever the table entries needed to do so have been read into memory. The tool retains each table entry in memory until it has generated an estimate of the dimensions of each conductor for which the information provided by that table entry is needed.

By reading the database table entries for conductors of each layer in the particular order in which they were sorted, the RC extraction tool is able to quickly estimate the dimensions and resistance of each conductor of the IC without having to read a table entry for any conductor into memory more than once, and without having to store substantial numbers of table entries in memory at the same time. Thus the invention improves the speed with which an RC extraction tool estimates path resistances without requiring access to large amounts of memory.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to software stored on computer readable media which when read and executed by a conventional computer, causes the computer to act as a tool for estimating resistances of conductors within an integrated circuit (IC) based on information obtained from data describing the layout of the IC. Suitable computer-readable media for storing software include, but are not limited to, compact disks, floppy disks, hard disks, and random access or read only memory. While the specification describes at least one exemplary embodiment of the invention considered to be a best mode of practicing the invention, the invention is not limited to the exemplary embodiment(s) described below or to the manner in which the exemplary embodiments operate.

Figure 6:
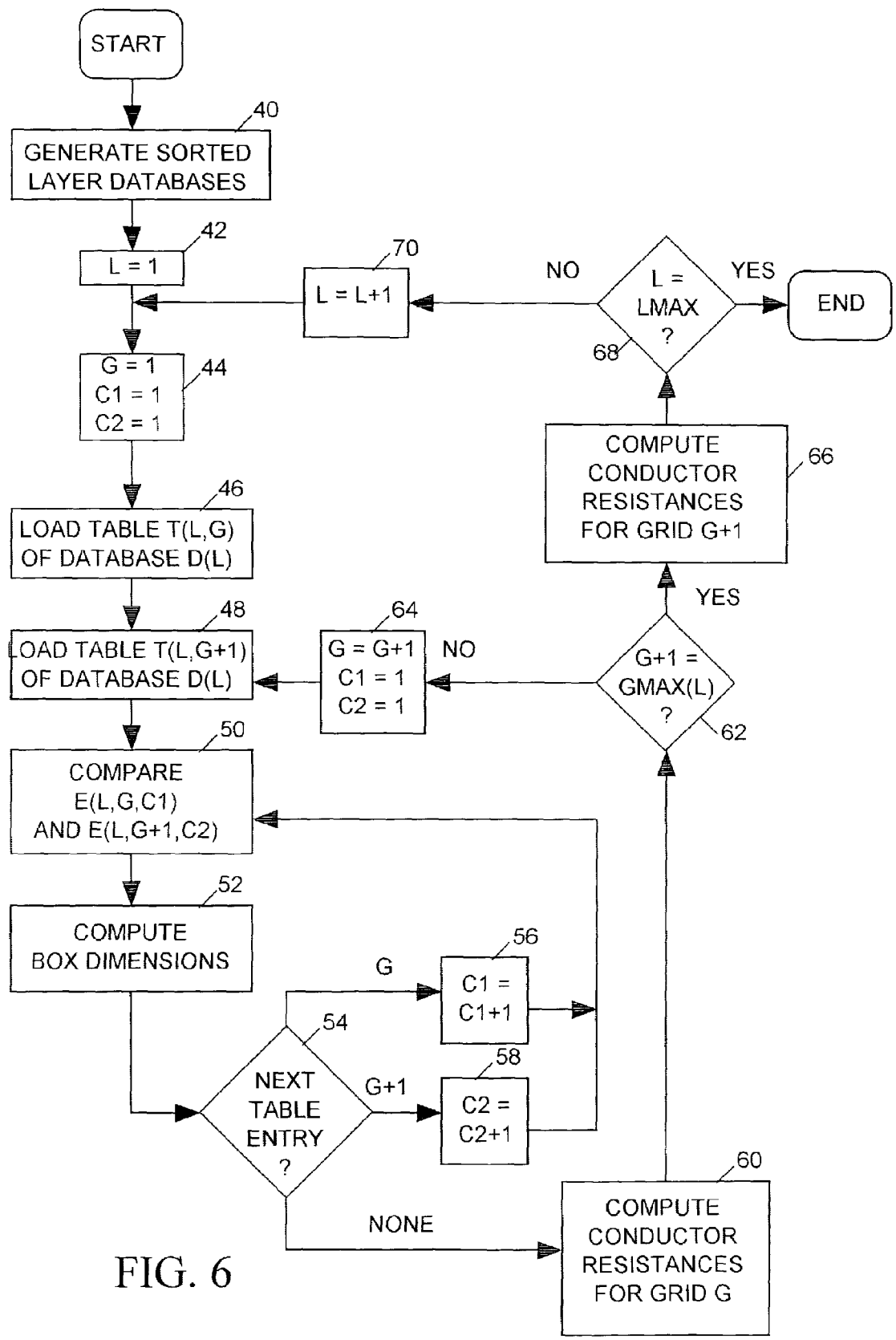
FIG. 6 is a flow chart illustrating a method in accordance with an embodiment of the invention for estimating IC conductor resistances.

FIG. 6 depicts in flow chart form a method in accordance with an embodiment of the invention that a computer-aided RC extraction tool can use for computing conductor resistances in an IC layout in a way that not only takes diffraction effects into account but also minimizes the number of times the RC extraction tool needs to access the layout data.

Referring to FIG. 6, the tool initially processes the layout to generate a separate, sorted database D(L) for each conductor layer L (step 40). Each layer database D(L) includes a separate table for each grid line, and the table T(L,G) for each $G^{th}$ grid line includes an entry E(L,G,N) for each $N^{th}$ conductor along that grid line. For example the database for the IC layer L illustrated in FIG. 5 would include 6 tables T(L,1) through T(L,6) for grid lines G=1 through 6, respectively. Thus the tables of each layer database D(L) are sorted in the order in which the layout data indicates the grid lines appear on layer L. In the table T(L,G) for each grid line G, the entries of corresponding to each conductor are sorted in the order their corresponding conductors are to reside along that grid line. For example the table T(L,1) corresponding to the first (leftmost) grid line 1 includes a first entry E(L,1,1) for conductor 30 and a second entry E(L,1,2) for conductor 31. The $N^{th}$ table entry E(L,G,N) of each table T(L,G) indicates endpoint coordinates of the $N^{th}$ conductor along the $G^{th}$ grid line of the layer, and those endpoint coordinates fully define the nominal shape and position of the $N^{th}$ conductor along the grid line.

The RC extraction tool next sets a layer variable L to 1 so that it references the IC's first conductor layer (step 42) and sets each of variables G, C1 and C2 equal to 1 (step 44). With L=G=1, at steps 46 and 48 the tool loads the first and second tables T(L,G)=T(L,1) and T(L,G+1)= T(L,2) of the first layer database D(L) D(1) into memory so that it can access their entries.

Figure 1:
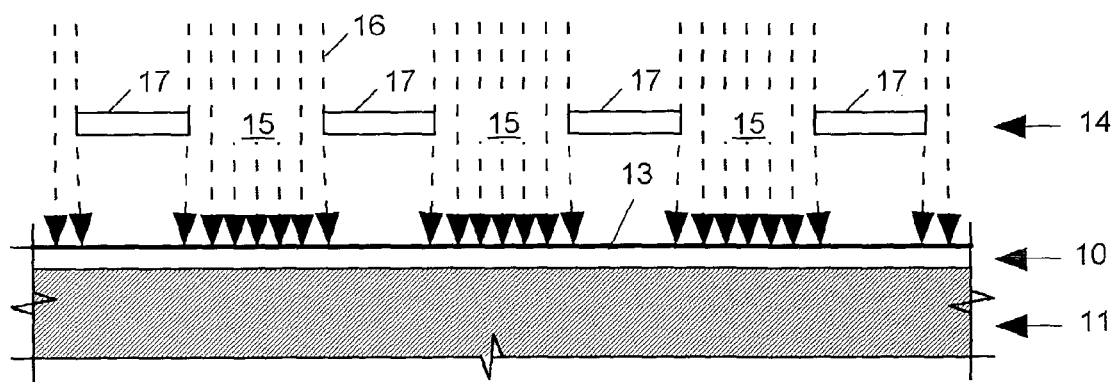
FIGS. 1–4 are side elevation views of portions of integrated circuits during various stages of a prior art fabrication process.
Figure 2:
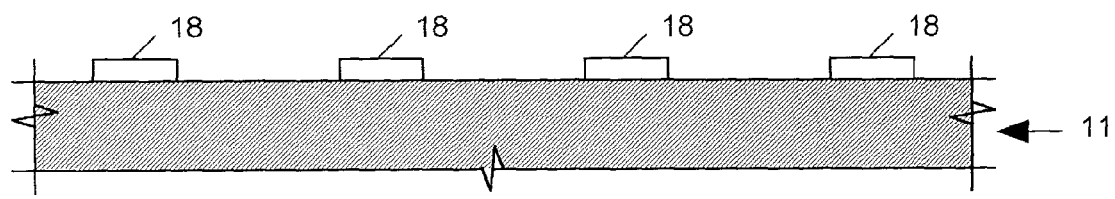
Figure 3:
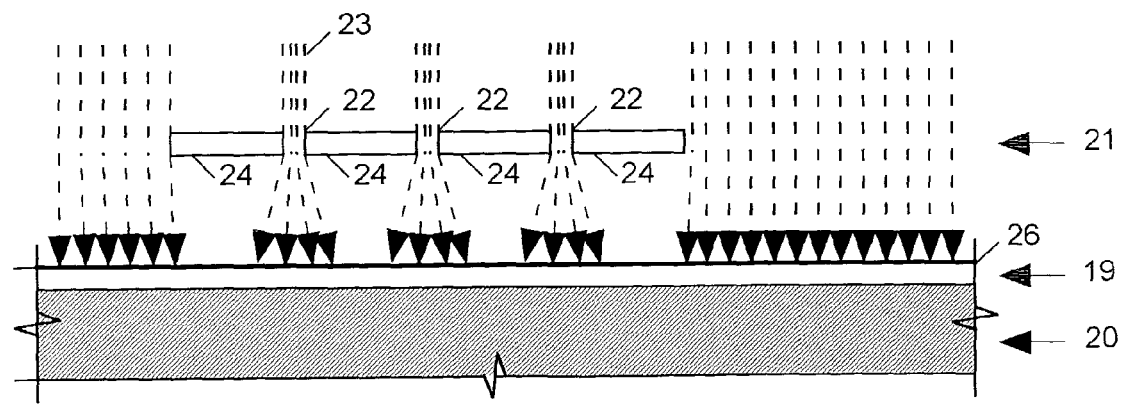
Figure 4:
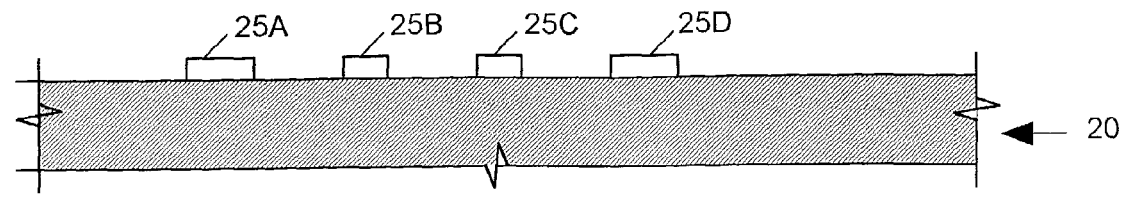
Figure 5:
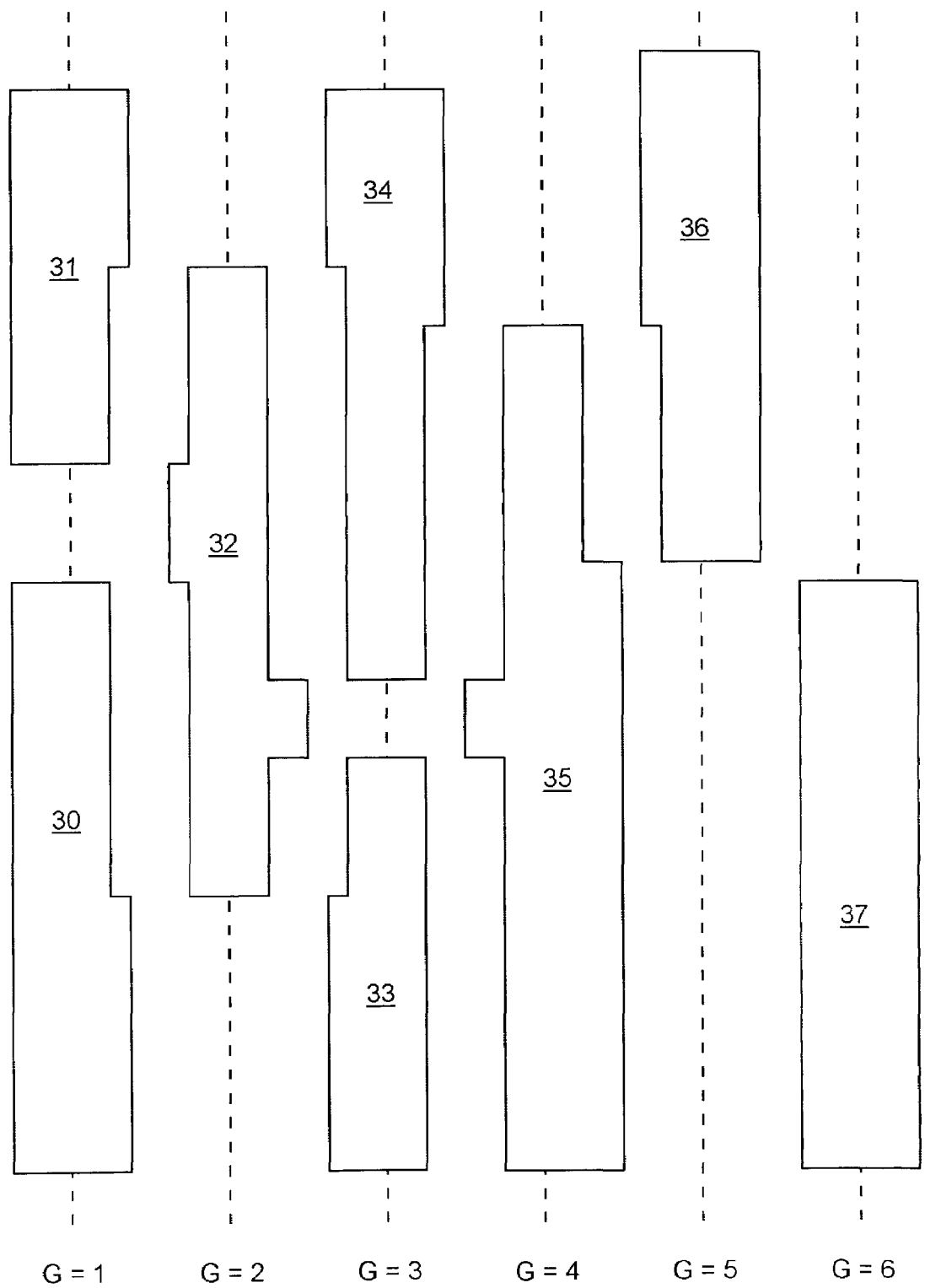
FIG. 5 is a simplified plan view of conductors residing on a portion of a layer of a prior art IC.
Figure 7:
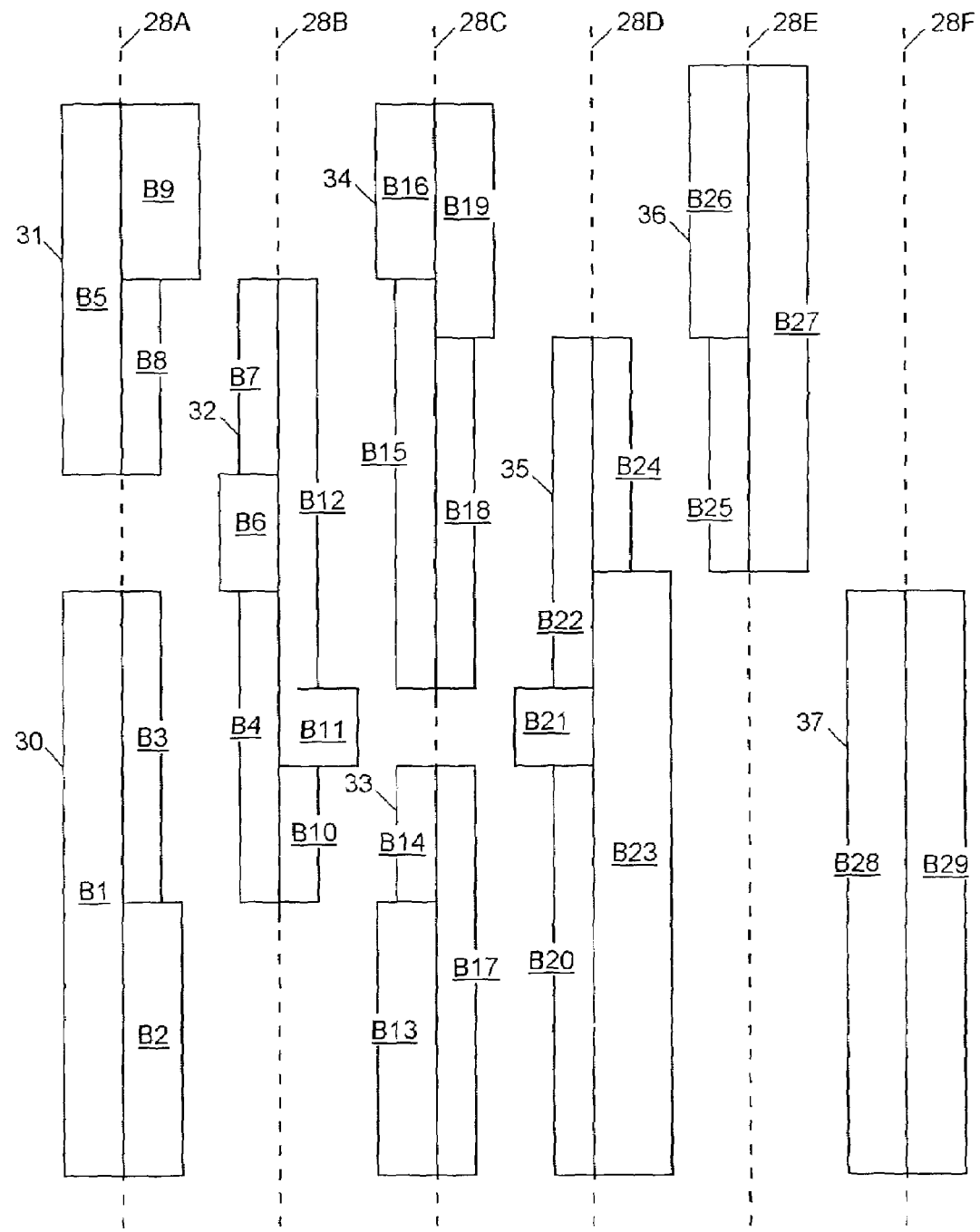
FIG. 7 is a plan view of conductors residing on a portion of a layer of an IC depicting sections of each conductor for which the method of FIG. 6 separately computes dimensions.

FIG. 7 shows how the RC extraction tool views polygonal conductors 30–37 of FIG. 5 as a set of rectangular boxes B1–B29. The dimensions of each box B1–B29 forming a part of a conductor depend not only the positions of that conductor's endpoints, but also on the endpoint positions of any adjacent conductors. At step 50, the tool compares the endpoint data included in the entries E(L,G,C1)=E(L,1,1) and E(L,G+1,C2)=E(L,2,1) for conductors 30 and 32 and then computes the dimensions of any boxes forming either of the conductors for which it has sufficient information to determine. Knowing the endpoint positions of conductors 30 and 31, the RC extraction tool can determine at step 52 the dimensions of boxes B1–B4.

The tool then decides at step 54 whether it should access the next entry in table T(L,G) or T(L,G+1). When the conductor represented by the last read entry E(L,G,C1) of table T(L,G) extends farther along its grid line than the conductor represented by last read entry E(L,G+1,C2) of table T(L,G+1), and when a next entry in table T(L,G) exists, then the tool increments C1 (step 56) so that the next entry E(L,G,C1) of table T(L,G) will be read. When the conductor represented by the last read entry E(L,G,C1) of table T(L,G) does not extend farther along its grid line than the last read entry E(L,G+1,C2) of table T(L,G), and a next entry in table T(L,G+1) exists, then the tool increments C2 (step 58) so that the next entry E(L,G+1,C2) of table T(L,G+1) will be read.

Initially, since conductor 32 extends farther along its grid line than conductor 30, the tool increments C1 at step 56 and then returns to step 50 to compare endpoints of conductors 31 and 32 as indicated by table entries E(L,1,2) and E(L,2,1). Based on this information, and knowing that entry E(L,2,1) is the last entry in table T(L,G+1), the tool is able to compute the dimensions of boxes B5–B9 (step 52). Since there are no more entries in either table T(L,G) or T(L,G+1) to process (step 54), the tool is now able to compute the resistance of each conductor 30 and 31 referenced by table T(L,G) (step 60) because it has determined the dimensions of all boxes forming those conductors.

If G+1 is not equal to GMAX(L), the number of the last grid line of the layer L represented by the currently selected database D(L) (step 62), the tool increments G and resets C1 and C2 to 1 (step 64), and then loads table T(L,G+1)=T(L,3) into memory, overwriting the table T(L,G) T(L,1) which is no longer needed (step 48). The tool, now having in memory the tables T(L,2) and T(L,3) corresponding to grid lines 2 and 3, repeats steps 50 through 58 until it has determined the dimensions of all boxes B10–B12 forming the right side of conductor 32 and the dimensions of all boxes B13–B16 forming the left sides of conductors 33 and 34. The tool then computes the resistance of conductor 32 (step 60), the only conductor on grid G.

The tool continues to loop through steps 48–64 working its way through the tables of database D to compute the dimensions of boxes forming conductors on each grid line until it determines at step 62 that G+1 has reached GMAX (L). At that point the tool can compute the resistance of the conductor 37 residing the last grid line 6 (step 66). When L is not equal to LMAX, the number of the last IC layer to be processed (step 68), the tool increments L to select the database D(2) for the second IC layer (step 70), and then repeats steps 44–70 to determine the resistance of all conductors on layer 2. The tool continues to determine conductor resistance in a similar manner for each layer until at 68 it determines that it has determine resistances conductors on the last layer L=LMAX.

The conductor resistance is computed at step 60 or 66 based on the dimensions of the rectangular boxes that form it as follows:

Let L represent the total length of a conductor.

Let $L_{1j}$ represent the length of the conductor's $j^{th}$ left side box.

Let $L_{2j}$ represent the length of the conductor's $j^{th}$ right side box.

Let $\omega$ represent the nominal width of the conductor absent diffraction effects.

Let $\omega_{1j}$ represent the actual width of the conductor's $j^{th}$ left side box.

Let $\omega_{2j}$ represent the actual width of the conductor's $j^{th}$ right side box.

Let R be the total resistance of the conductor.

Let $\tau$ be the thickness of the conductor.

Let $\rho$ be the resistivity of the conductor.

Let A be the nominal cross-sectional area of a conductor such that $A=\omega\tau$.

Let $R_n$ be the nominal resistance of right or left side of a conductor of nominal dimensions where $R_n=2\rho L/A$.

Let $\Delta R_{1j}$ be the actual resistance of the $j^{th}$ left side box of a conductor where $\Delta R_{1j}=(\rho/\tau)L_{1j}[(1/\omega_{1j})-(2/\omega)]$ then $$R=[R_n^2+R_n(\Delta R_1+\Delta R_2)+\Delta R_1\Delta R_2]/[2R_n+\Delta R_1+\Delta R_2]$$

where $$\Delta R_1 = \sum_j \Delta R_{1j}$$

and $$\Delta R_2 = \sum_j \Delta R_{2j}$$

Figure 8:
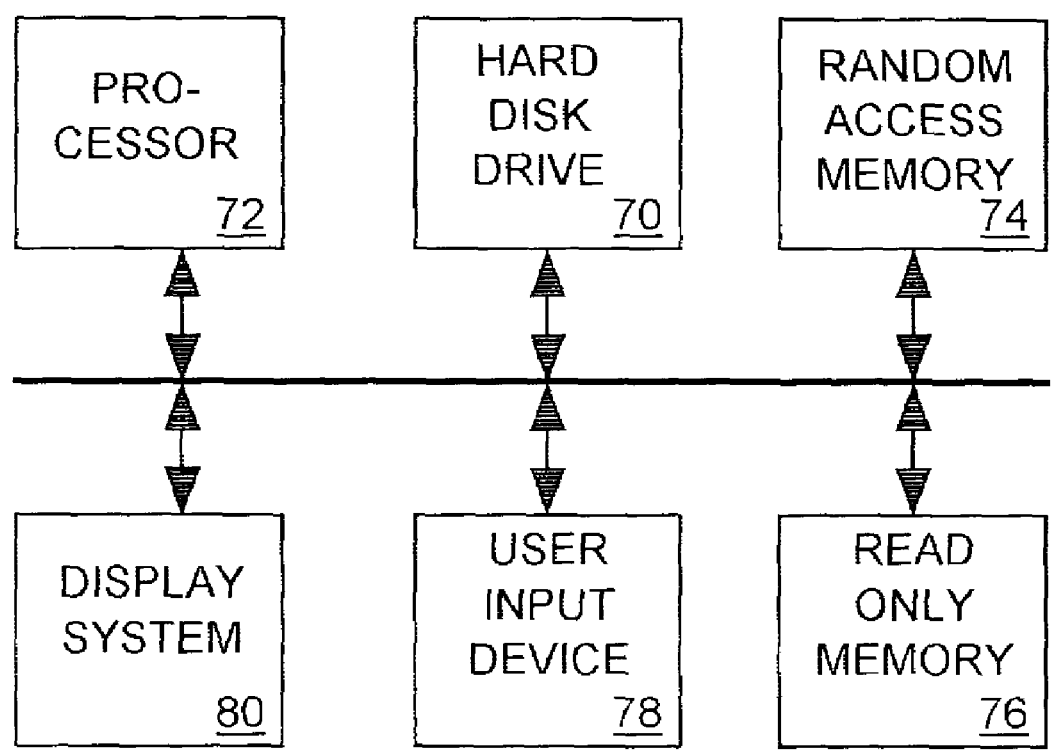
FIG. 8 is a block diagram of a computer for implementing the method of FIG. 6.

FIG. 8 illustrates in block diagram form a computer 68 for carrying out the resistance estimation method illustrated in FIG. 6. Data describing an IC layout is stored in an file on a hard disk drive 70. A conventional computer processor 72 executes software stored on hard disk drive 70 (or other computer-readable media) causing processor 72 to process the layout data file stored on hard disk drive 70 to estimate conductor resistance in the manner described by FIG. 6. Computer 68 suitably includes a random access memory for in which processor 72 stores tables of the databases it creates when they are needed. Computer 68 may also include read only memory 76, one or more user input devices 78 and a display system 80.

By converting the layout data into separate databases for each IC conductor layer, with the databases being sorted as described above, computer 68 is able to quickly estimate the dimensions and resistance of each conductor of the IC without having to read a table entry for any conductor into memory 74 more than once and without having to store more than two database tables in memory 74 at the same time. The invention helps to reduce both processing time and the amount of memory 74 needed to estimate conductor resistances.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for estimating resistances of conductors to reside on layers of an integrated circuit (IC) to be fabricated in accordance with layout data indicating nominal dimensions of each conductor and indicating that conductors on each layer are to be centered at indicated positions along parallel grid lines G=1 through GMAX(L), wherein GMAX(L) for each layer L is an integer greater than 1, and wherein when the IC is fabricated, actual dimensions of each conductor residing on any grid line on any layer are functions of its nominal dimension and of the nominal dimensions and relative position of any adjacent conductor residing on any adjacent grid line of the same layer, the method comprising the steps of:
   a. processing the layout data to generate a separate database D(L) for each layer L of the IC, wherein each database D(L) includes a separate table T(L,G) corresponding to each grid line G of layer L, wherein each table T(L,G) of each database D(L) includes a separate table entry corresponding to each conductor to reside along the $G^{th}$ grid line the $L^{th}$ layer, wherein each table entry contains information indicating its corresponding conductor's nominal dimensions and its position along the grid line on which it is to reside; and
   b. separately processing the database D(L) for each $L^{th}$ layer to estimate resistance of each conductor that is to reside along any grid line on the $L^{th}$ layer as a function of the nominal dimensions and relative positions of that conductor and of any adjacent conductor that is to reside along an adjacent grid line of the same layer,
   wherein step b comprises the substeps of, for each value of L:
   b1. estimating actual dimensions of conductor sections to reside on a side of grid line G=1 most remote from grid line G=2 of layer L as functions of nominal conductor dimensions and of positions indicated by entries of table T(L,1);
   b2. for each value of G from G to GMAX(L)−1, estimating actual dimensions of conductor sections to reside between grid lines G and G+1 of layer L as functions of nominal conductor dimensions and positions indicated by entries of tables T(L,G) and T(L,G+1), and estimating resistance of each conductor along grid line G as a function of estimated actual dimensions of its sections residing on both sides of grid line G; and
   b3. estimating actual dimensions and positions of sections of conductors residing on a side of grid line GMAX(L) most remote from grid line GMAX(L)−1 as functions of nominal conductor dimensions and positions indicated by entries of table T(L,GMAX(L)), and estimating resistance of each conductor to reside along grid line GMAX(L) as a function of estimated actual dimensions of its sections.

2. The method in accordance with claim 1 wherein at step a the tables T(L,G) of each database D(L) are sorted within database D(L) in accordance with an order in which the layout data indicates their corresponding grid lines are arranged on layer L.

3. The method in accordance with claim 2 wherein at step a the entries of the table T(L,G) for each grid line G of each layer L are sorted within the table in accordance with an order in which the layout data indicates their corresponding conductors are arranged along that grid line.

4. The method in accordance with claim 3 wherein at step a the tables T(L,G) of each database D(L) are sorted within that database in accordance with an order in which the layout data indicates their corresponding grid lines are arranged on layer L.

5. The method in accordance with claim 4 wherein at step a the entries of the table T(L,G) for each grid line G of each layer L are sorted within that table in accordance with an order in which the layout data indicates their corresponding conductors are arranged along that grid line.

6. The method in accordance with claim 1
   wherein step b1 comprises obtaining information from each table entry of table T(L,1) in an order in which the table entry's corresponding conductors are to reside along grid line G=1; and
   wherein step b2 comprises for each database D(L) obtaining information from each table entry of each table T(L,G) of database D(L) in an order in which the layout data indicates the table's corresponding grid lines are arranged on layer L, with information being obtained from table entries of each table in an order in which the table entry's corresponding conductors are to reside along the grid line corresponding to the table.

7. Computer-readable media, which when read and executed by a computer causes the computer to carry out a method for estimating resistances of conductors to reside on layers of an integrated circuit (IC) to be fabricated in accordance with IC layout data indicating nominal dimensions of each conductor and indicating that conductors on each layer are to be centered at indicated positions along parallel grid lines G=1 through GMAX(L), wherein GMAX(L) for each layer L is an integer greater than 1, wherein when the IC is fabricated, actual dimensions of each conductor residing on any grid line on any layer are functions of its nominal dimension and of the nominal dimensions and relative position of any adjacent conductor residing on any adjacent grid line of the same layer, wherein the method comprises the steps of:
   a. processing the layout data to generate a separate database D(L) for each layer L of the IC, wherein each database D(L) includes a separate table T(L,G) corresponding to each grid line G of layer L, wherein each table T(L,G) of each database D(L) includes a separate table entry corresponding to each conductor to reside along the $G^{th}$ grid line of the $L^{th}$ layer, wherein each table entry contains information indicating its corresponding conductor's nominal dimensions and its position along the grid line on which it is to reside; and
   b. separately processing the database D(L) for each $L^{th}$ layer to estimate resistance of each conductor that is to reside along any grid line on the $L^{th}$ layer as a function of the nominal dimensions and relative positions of that conductor and of any adjacent conductor that is to reside along an adjacent grid line of the same layer,
   wherein step b comprises the substeps of, for each value of L;

b1. estimating actual dimensions of conductor sections to reside on a side of grid line G=1 most remote from grid line G=2 of layer L as functions of nominal conductor dimensions and of positions indicated by entries of table T(L,1);

b2. for each value of G from G to GMAX(L)−1, estimating actual dimensions of conductor sections to reside between grid lines G and G+1 of layers L as functions of nominal conductor dimensions and positions indicated by entries of tables T(L,G) and T(L,G+1), and estimating resistance of each conductor along grid line G as a function of estimated actual dimensions of its sections residing on both sides of grid line G; and b3. estimating actual dimensions and positions of sections of conductors residing on a side of grid line GMAX(L) most remote from grid line GMAX(L)−1 as functions of nominal conductor dimensions and positions indicated by entries of table T(L,GMAX(L)), and estimating resistance of each conductor to reside along grid line GMAX(L) as a function of estimated actual dimensions of its sections, wherein step b1 comprises obtaining information from each table entry of table T(L,1) in an order in which the table entry's corresponding conductors are to reside along grid line G=1; and wherein step b2 comprises for each database D(L) obtaining information from each table entry of each table T(L,G) of database D(L) in an order in which the layout data indicates the table's corresponding grid lines are arranged on layer L, with information being obtained from table entries of each table in an order in which the table entry's corresponding conductors are to reside along the grid line corresponding to the table.

8. The computer-readable media in accordance with claim 7 wherein at step a the tables T(L,G) of each database D(L) are sorted within database D(L) in accordance with an order in which the layout data indicates their corresponding grid lines are arranged on layer L.

9. The computer-readable media in accordance with claim 8 wherein at step a the entries of the table T(L,G) for each grid line G of each layer L are sorted within the table in accordance with an order in which the layout data indicates their corresponding conductors are arranged along that grid line.

10. The computer-readable media in accordance with claim 9 wherein at step a the tables T(L,G) of each database D(L) are sorted within that database in accordance with an order in which the layout data indicates their corresponding grid lines are arranged on layer L.

11. The computer-readable media in accordance with claim 10 wherein at step a the entries of the table T(L,G) for each grid line G of each layer L are sorted within that table in accordance with an order in which the layout data indicates their corresponding conductors are arranged along that grid line.

12. A method for estimating resistances of conductors to reside on layers of an integrated circuit (IC) to be fabricated in accordance with layout data indicating nominal dimensions of each conductor and indicating that conductors on each layer are to be centered at indicated positions along parallel grid lines G=1 through GMAX(L) wherein GMAX (L), for each layer L is an integer greater than 1, and wherein when the IC is fabricated, actual dimensions of each conductor residing on any grid line on any layer are functions of its nominal dimension and of the nominal dimensions and relative position of any adjacent conductor residing on any adjacent grid line of the same layer, the method comprising the steps of:

a. processing the layout data to generate a separate database D(L) for each layer L of the IC, wherein each database D(L) includes a seperate table T(L,G) corresponding to each grid line G of layer L, wherein each table T(L,G) of each database D(L) includes a seperate table entry corresponding to each conductor to reside along the $G^{th}$ grid line the $L^{th}$ layer, wherein each table entry contains information indicating its corresponding conductor's nominal dimensions and its position along the grid line on which it is to reside; and b. separately processing the database D(L) for each $L^{th}$ layer to estimate resistance of each conductor that is to reside along any grid line on the $L^{th}$ layer as a function of the nominal dimensions and relative positions of that conductor and of any adjacent conductor that is to reside along an adjacent grid line of the same layer wherein at step a the entries of the table T(L,G) for each grid line G of each layer L are sorted within the table in accordance with an order in which the layout data indicates their corresponding conductors are arranged along that grid line, wherein at step a the tables T(L,G) of each database D(L) are sorted within that database in accordance with an order in which the layout data indicates their corresponding grid lines are arranged on layer L, wherein step b comprises the substeps of, for each value of L:

b1. estimating actual dimensions of conductor sections to reside on a side of grid line G=1 most remote from grid line G=2 of layer L as functions of nominal conductor dimensions and of positions indicated by entries of table T(L,1);

b2. for each value of G from G to GMAX(L)−1, estimating actual dimensions of conductor sections to reside between grid lines G and G+1 of layer L as functions of nominal conductor dimensions and positions indicated by entries of tables T(L,G) and T(L,G+1), and estimating resistances of each conductor along grid line G as a function of estimated actual dimensions of its sections residing on both sides of grid line G; and b3. estimating actual dimensions and positions of sections of conductors residing on a side of grid line GMAX(L) most remote from grid line GMAX(L)−1 as functions of nominal conductor dimensions and positions indicated by entries of table T(L,GMAX(L)), and estimating resistances of each conductor to reside along grid line GMAX(L) as a function of estimated actual dimensions of its sections, and wherein the total resistance R of each conductor is estimated at step b2 in accordance with the expression $$R=[R_n^2+R_n(\Delta R_1+\Delta R_2)+\Delta R_1\Delta R_2]/[2R_n+\Delta R_1+\Delta R_2]$$

where L represents a total length of the conductor, where $L_{1j}$ represents a length of the conductors $j^{th}$ left side box, where $L_{2j}$ represents a length of the conductors $j^{th}$ right side box, where ω represents a nominal width of the conductor absent diffraction effects, where $\omega_{1j}$ represents an actual width of the conductors $j^{th}$ left side box, where $\omega_{2j}$ represents an actual width of the conductors $j^{th}$ right side box, where τ represents a thickness of the conductor, where ρ represents a resistivity of the conductor,
where A represents a nominal cross-sectional area of the conductor such that A=ωτ,
where $R_n$ represents a nominal resistance of the conductor,
where $R_n=2\rho L/A$,
where $\Delta R_{1j}$ represents an actual resistance of a $j^{th}$ left side box of a conductor,
where $\Delta R_{1j}=(\rho/\tau)L_{1j}[(1/\omega_{1j})-(2/\omega)]$,
where $$\Delta R_1 = \sum_j \Delta R_{1j}$$

where $$\Delta R_2 = \sum_j \Delta R_{2j}.$$

13. Computer-readable media, which when read and executed by a computer causes the computer to carry out a method for estimating resistances of conductors to reside on layers of an integrated circuit (IC) to be fabricated in accordance with IC layout data indicating nominal dimensions of each conductor and indicating that conductors on each layer are to be centered at indicated positions along parallel grid lines G=1 through GMAX(L), wherein GMAX (L) for each layer L is an integer greater than 1, wherein when the IC is fabricated, actual dimensions of each conductor residing on any grid line on any layer are functions of its nominal dimension and of the nominal dimensions and relative position of any adjacent conductor residing on any adjacent grid line of the same layer, wherein the method comprises the steps of:
  a. processing the layout data to generate a separate database D(L) for each layer L of the IC, wherein each database D(L) includes a separate table T(L,G) corresponding to each grid line G of layer L, wherein each table T(L,G) of each database D(L) includes a separate table entry corresponding to each conductor to reside along the $G^{th}$ grid line of the $L^{th}$ layer, wherein each table entry contains information indicating its corresponding conductor's nominal dimensions and its position along the grid line on which it is to reside; and
  b. seperately processing the database D(L) for each $L^{th}$ layer to estimate resistance of each conductor that is to reside along any grid line on the $L^{th}$ layer as a function of the nominal dimensions and relative positions of that conductor and of any adjacent conductor that is to reside along an adjacent grid line of the same layer,
wherein at step a the tables T(L,G) of each database D(L) are sorted within database D(L) in accordance with an order in which the layout data indicates their corresponding grid lines are arranged on layer L,
wherein at step a the entries of the table T(L,G) for each grid line G of each layer L are sorted within the table in accordance with an order in which the layout data indicates their corresponding conductors are arranged along that grid line,
wherein at step a the tables T(L,G) of each database D(L) are sorted within that database in accordance with an order in which the layout data indicates their corresponding grid lines are arranged on layer L, wherein step b comprises the substeps of, for each value of L:
  b1. estimating actual dimensions of conductor sections to reside on a side of grid line G=1 most remote from grid line G2 of layer L as functions of nominal conductor dimensions and of positions indicated by entries of table T(L,1);
  b2. for each value of G from G to GMAX(L)-1, estimating actual dimensions of conductor sections to reside between grid lines G and G+1 of layer L as functions of nominal conductor dimensions and positions indicated by entries of tables T(L,G) and T(L,G+1), and estimating resistances of each conductor along grid line G as a function of estimated actual dimensions of its sections residing on both sides of grid line G; and
  b3. estimating actual dimensions and positions of sections of conductors residing on a side of grid line GMAX(L) most remote from grid line GMAX(L)-1 as functions of nominal conductor dimensions and positions indicated by entries of table T(L,GMAX(L)), and estimating resistances of each conductor to reside along grid line GMAX(L) as a function of estimated actual dimensions of its sections, and
wherein the total resistance R of each conductor is estimated at step b2 in accordance with the expression $$R=[R_n^2+R_n(\Delta R_1+\Delta R_2)+\Delta R_1\Delta R_2]/[2R_n+\Delta R_1+\Delta R_2]$$

where L represents a total length of the conductor,
where $L_{1j}$ represents a length of the conductor's $j^{th}$ left side box,
where $L_{2j}$ represents a length of the conductor's $j^{th}$ right side box,
where ω represents a nominal width of the conductor absent diffraction effects,
where $\omega_{1j}$ represents an actual width of the conductor's $j^{th}$ left side box,
where $\omega_{2j}$ represents an actual width of the conductor's $j^{th}$ right side box,
where τ represents a thickness of the conductor,
where ρ represents a resistivity of the conductor,
where A represents a nominal cross-sectional area of the conductor such that A =ωτ,
where $R_n$ represents a nominal resistance of the conductor,
where $R_n=2\rho L/A$,
where $\Delta R_{1j}$ represents an actual resistance of a $j^{th}$ left side box of a conductor,
where $\Delta R_{1j}=(\rho/\tau)L_{1j}[(1/\omega_{1j})-(2/\omega)]$,
where $$\Delta R_1 = \sum_j \Delta R_{1j}$$

where $\Delta R_{1j}=(\rho/\tau)L_{1j}[(1/\omega_{1j})-(2/\omega)]$,
and where $$\Delta R_2 = \sum_j \Delta R_{2j}.$$

\* \* \* \* \*